United States Patent
Lin et al.

(10) Patent No.: US 8,748,200 B2
(45) Date of Patent: Jun. 10, 2014

(54) METHOD FOR MANUFACTURING LED PACKAGE

(71) Applicant: Advanced Optoelectronic Technology, Inc., Hsinchu Hsien (TW)

(72) Inventors: Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/942,716

(22) Filed: Jul. 16, 2013

(65) Prior Publication Data

US 2013/0302919 A1 Nov. 14, 2013

Related U.S. Application Data

(62) Division of application No. 13/326,341, filed on Dec. 15, 2011, now Pat. No. 8,513,695.

(30) Foreign Application Priority Data

Apr. 26, 2011 (CN) .......................... 2011 1 1050377

(51) Int. Cl.
*H01L 21/00* (2006.01)

(52) U.S. Cl.
USPC .................................. 438/26; 438/27; 438/29

(58) Field of Classification Search
CPC .......... H01L 33/56; H01L 33/60; H01L 33/52; H01L 2224/4807
USPC ...................................................... 438/26, 29
See application file for complete search history.

(56) References Cited

U.S. PATENT DOCUMENTS

| 7,279,719 | B2* | 10/2007 | Suehiro et al. | 257/98 |
| 2003/0006421 | A1* | 1/2003 | Yasukawa et al. | 257/98 |
| 2007/0181900 | A1* | 8/2007 | Sato et al. | 257/99 |
| 2010/0289048 | A1* | 11/2010 | Kumura | 257/98 |
| 2012/0161178 | A1* | 6/2012 | Lin et al. | 257/98 |

\* cited by examiner

*Primary Examiner* — Thien F Tran
(74) *Attorney, Agent, or Firm* — Novak Druce Connolly Bove + Quigg LLP

(57) ABSTRACT

A method for making an LED package includes the following steps: providing a substrate with an electrode formed thereon; forming at least one barrier portion on the electrode; forming a reflective cup on the substrate wherein the reflective cup covers the at least one barrier portion; providing an LED die in the reflective cup and electrically connecting the LED die to the electrode; and forming an encapsulation in the reflective cup, the encapsulation covering the LED die.

3 Claims, 8 Drawing Sheets

US 8,748,200 B2

METHOD FOR MANUFACTURING LED PACKAGE

CROSS-REFERENCE TO RELATED APPLICATIONS

This patent application is a divisional application of patent application Ser. No. 13/326,341, filed on Dec. 15, 2011, entitled "LED PACKAGE AND METHOD FOR MAKING THE SAME," which is assigned to the same assignee as the present application, and which is based on and claims priority from Chinese Patent Application No. 201110105037.7 filed in China on Apr. 26, 2011. The disclosures of patent application Ser. No. 13/326,341 and the Chinese Patent Application No. 201110105037.7 are incorporated herein by reference in their entirety.

BACKGROUND

1. Technical Field

The present disclosure generally relates to light emitting diode (LED) packages and method for making the same.

2. Description of Related Art

Generally, an LED package includes a substrate, an LED die arranged on the substrate, a reflective cup formed around the LED die and an encapsulation formed on the substrate to cover the LED die. However, due to that there are usually gaps remained between the substrate and the reflective cup, moisture and dust can easily infiltrate into the LED package through the gaps, thereby leading to poor reliability and short service life of the LED package.

Therefore, it is necessary to provide an LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages, method for making the LED packages, in detail.

Figure 1:
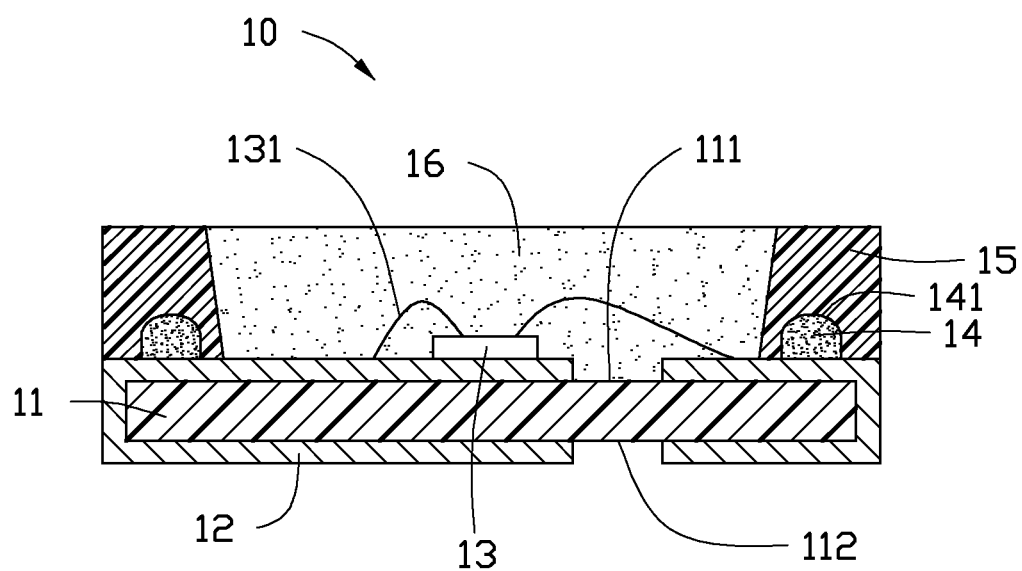
FIG. 1 is a schematic, cross-sectional view of an LED package in accordance with an embodiment of the present disclosure.
Figure 2:
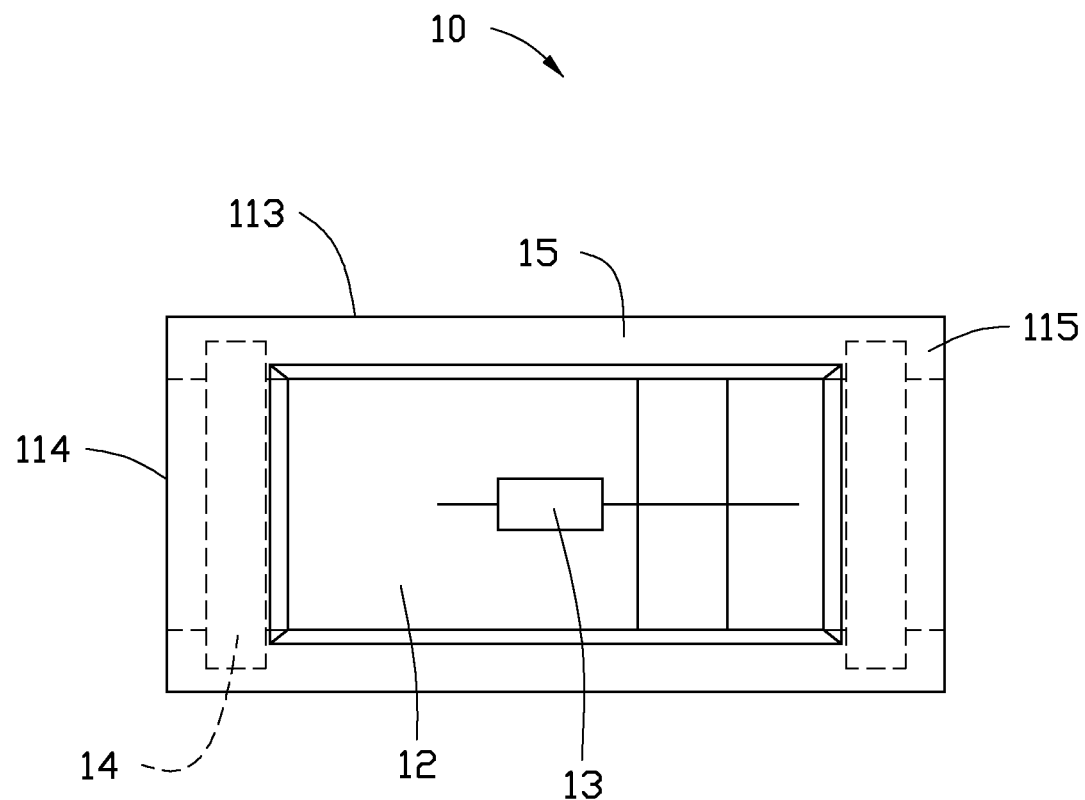
FIG. 2 is a schematic, top view of the LED package of FIG. 1.
Figure 3:
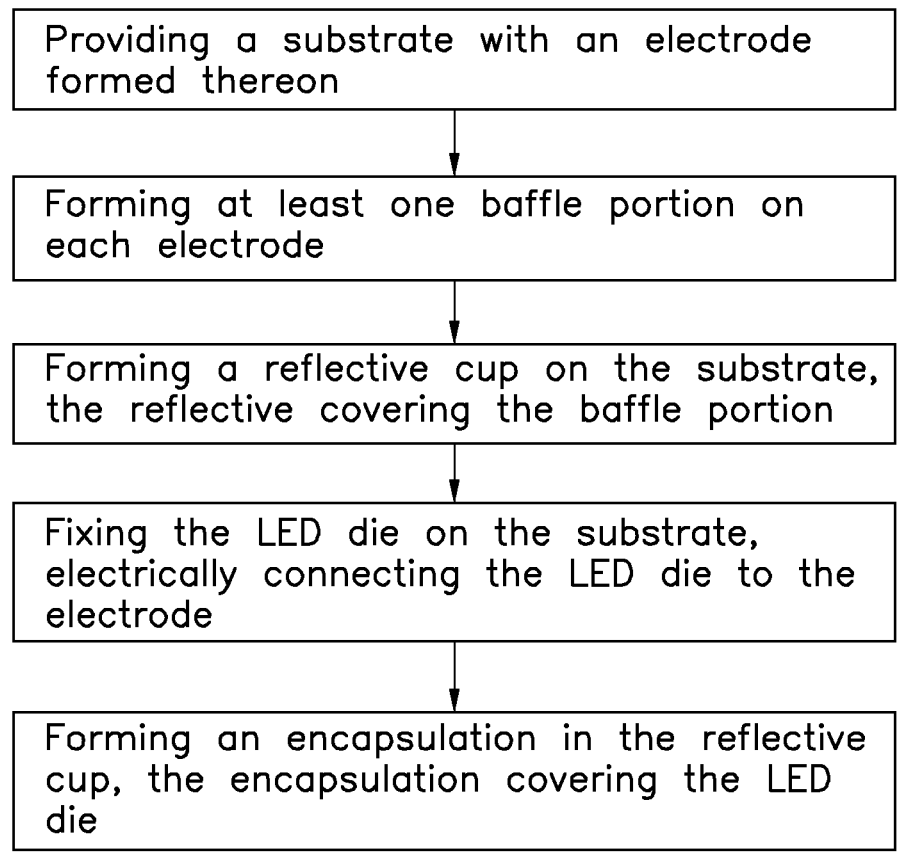
FIG. 3 is a flow chart of a method for forming an LED package in accordance with an embodiment of the present disclosure.

Referring to FIG. 1 and FIG. 2, an LED package 10 of an embodiment includes a substrate 11, two electrodes 12, an LED die 13, a barrier portion 14, a reflective cup 15, and an encapsulation 16.

Figure 5:
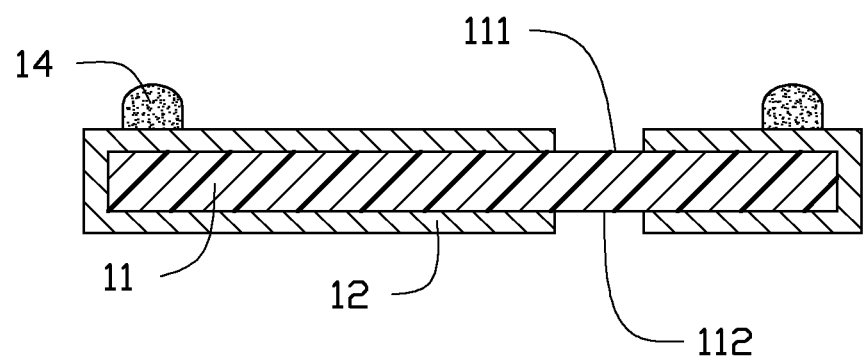

The substrate 11 can be made of a material with excellent thermal conductivity and electrical insulation, such as PPA (polyphosphoricacid) or ceramic. In this embodiment, the substrate 11 is rectangular and thin. Referring to FIG. 5 at the same time, the substrate 11 includes a first surface 111 and a second surface 112 opposite to the first surface 111. The first surface 111 is rectangular, and includes two opposite first sides 113 and two opposite second sides 114 perpendicular to the first sides 113. Alternatively, the first surface 111 can be circular or other desired shape according to actual requirements.

Figure 6:
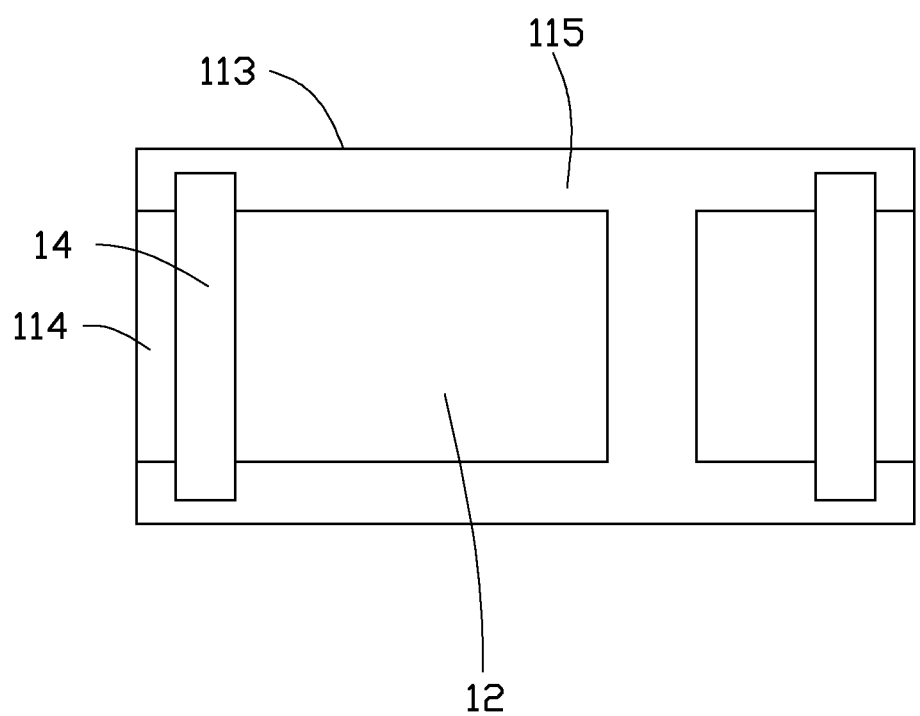

Referring to FIG. 6, the electrodes 12 are formed on the substrate 11, and spaced from each other. Each electrode 12 extends from a central portion of the first surface 111 to the second surface 112, across one second side 114. The electrodes 12 are spaced from the first sides 113. An insulation area 115 is thus defined between an edge of each electrode 12 and a corresponding adjacent first side 113. The electrodes 12 are made of metal with good electric conductivity, such as gold, silver, copper, platinum, aluminum, nickel, tin, magnesium or an alloy thereof.

The LED die 13 is mounted on one of the two electrodes 12, and electrically connected to the electrodes 12 by two metal wires 131. The LED die 13 can also be mounted on and electrically connected to the two electrodes 12 by flip chip bonding or eutectic bonding. Alternatively, the LED die 13 can be arranged on the first surface 111 of the substrate 11 and electrically connected to the two electrodes 12 by the two metal wires 131.

The barrier portion 14 is arranged on the electrode 12. In this embodiment, the barrier portion 14 includes two strips on the two electrodes 12 respectively, and sitting at two opposite sides of the LED die 13. Each strip spans across the corresponding electrode 12 along the extending direction of the second side 114 with two ends thereof contacts the insulation area 115.

The reflective cup 15 is formed on the first surface 111 and covers the barrier portion 14. The reflective cup 15 surrounds the LED die 13, and receives the LED die 13 therein. The material of the reflective cup 15 can be the same as the substrate 11, such as PPA. Moreover, the reflective cup 15 and the substrate 11 can be formed integrally as a single piece.

The encapsulation 16 is filled in the reflective cup 15. The encapsulation 16 is over the substrate 11 and covers the LED die 13 and the metal wires 131. The encapsulation 16 is made of silicone or epoxy resin. The encapsulation 16 includes light transmissive fluorescent materials evenly distributed therein. The fluorescent materials are, for example, YAG (yttrium aluminum garnet), TAG (terbium aluminum garnet), silicate, nitride, nitrogen oxides, phosphide and sulfide. The encapsulation 16 protects the LED die 13 from moisture and dust and helps the conversion of color of the light from the LED die 13 to a desired color.

The barrier portion 14 is made of a material, such as epoxy resin or silicone, with a bonding force to the corresponding electrode 12 larger than that of the reflecting cup 15 to the corresponding electrode 12. The barrier portion 14 is attached on and covers outer portions of the electrodes 12. Due to that the bonding force between the barrier portion 14 and the electrode 12 is larger than that between the reflective cup 15 and the electrode 12, a gap between the reflecting cup 15 and the electrodes 12 is greatly reduced by the barrier portion 14, and thus moisture and dust outside the LED package is difficult to infiltrate into the LED package 10 with the barrier portion 14. When the barrier portion 14 is made of epoxy resin with excellent bonding force with PPA which is usually employed to make the reflective cup 15, the barrier portion 14 acts as an interface layer firmly connecting the electrode 12 with the reflective cup 15. Furthermore, a curved connecting surface 141 is formed at each joint of the barrier portion 14 and the reflective cup 15, thereby increasing the distance of the path along which moisture and dust infiltrate into the LED package from outside. Thus, the moisture and dust are difficult to reach the LED die 13 to cause a harm thereto.

Referring to FIG. 3 to FIG. 8, the present disclosure further provides a method for making the LED package 10. The method includes following steps.

Figure 4:
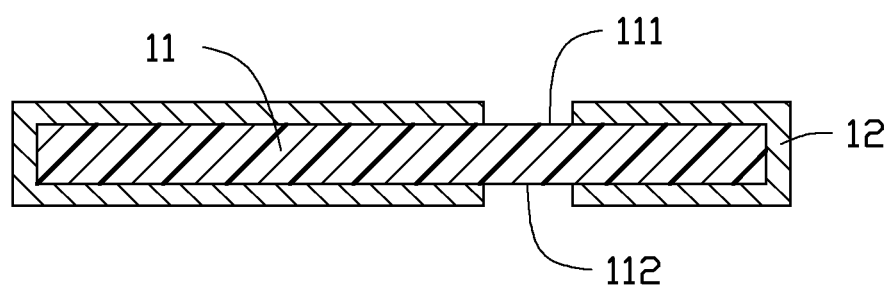
FIGS. 4-8 are schematic, cross-sectional views respectively showing various steps of the method of FIG. 3.

Referring to FIG. 4, the first step of the method includes providing a substrate 11. The substrate is rectangular and includes a first surface 111 and a second surface 112 opposite to the first surface 111. In this embodiment, the substrate 11 is made of PPA.

Two electrodes 12 are located on the substrate 11. The electrodes 12 are separated from each other. The electrodes 12 are made of metal with good electric conductivity, such as gold, silver, copper, platinum, aluminum, nickel, tin, magnesium or an alloy thereof. The electrodes 12 are made by electroplating, magnetron sputtering, chemical plating or wafer bonding.

Referring to FIG. 5 and FIG. 6, the second step includes forming a barrier portion 14 on the electrodes 12 by compression molding. In this embodiment, the barrier portion 14 includes two strips respectively extending across the electrodes 12. The barrier portion 14 is made of epoxy resin or silicone. The bonding force between the barrier portion 14 and the electrode is quite large.

Figure 7:
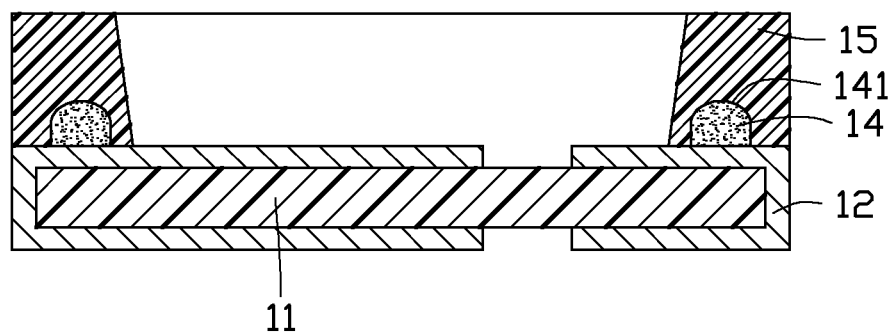

Referring to FIG. 7, the third step includes forming a reflective cup 15 by injection molding or transfer molding. The reflective cup 15 is formed on the first surface 111 of the substrate 11 along four sides thereof and covers the barrier portion 14 and parts of the electrodes 12. A chamber is defined inside the reflective cup 15 to receive the LED die 13. The reflective cup 15 is made of the same material as the substrate 11, such as PPA. The bonding force between the reflective cup 15 and the electrodes 12 is smaller than that between the barrier portion 14 and the electrodes 12.

Figure 8:
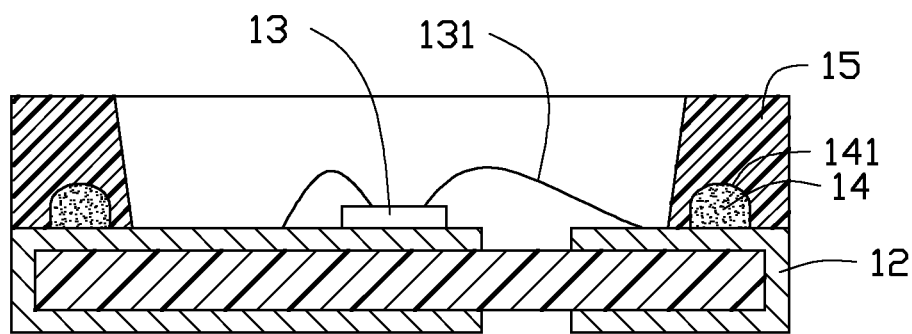

Referring to FIG. 8, the fourth step includes fixing the LED die 13 on the electrode 12. The LED die 13 is electrically connected with the electrodes 12 by metal wires 131. The LED die 13 is received in the reflective cup 15 and between the two barrier portions 14 covered by reflective cup 15.

Referring to FIG. 9, the last step includes forming a transparent encapsulation 16 in the reflective cup 15. The encapsulation 16 covers the LED die 13 and the metal wires 131. The encapsulation 11 is made of silicone or epoxy resin. The encapsulation 16 may include fluorescent materials distributed therein. The encapsulation 16 protects the LED die 13 from moisture and dust.

In summary, the barrier portion 14 is disposed in the reflective cup 15 and the bonding force between the barrier portion 14 and the electrode 12 is larger than that between the reflective cup 15 and the electrode 12. Thus, it is difficult for moisture and dust outside the LED package 10 to infiltrate into the LED package 10 through the joint of the reflective cup 15 and the electrodes 12 where the barrier portion 14 sits. Meanwhile, due to the blocking of the barrier portion 14 and a top of the barrier portion 14 has a curved profile, the path that moisture and dust can infiltrate into the LED package is curved whereby the length of the path is increased. As such, the barrier portion 14 effectively prevents the LED die 13 from being affected and damaged by moisture and dust. Furthermore, the bonding force between the barrier portion 14 and the reflective cup 15 is large, so that the electrode 12, and the reflective cup 15 are joined together firmly by the barrier portion 14.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for making an LED package, comprising:
providing a substrate with an electrode formed thereon;
forming at least one barrier portion on the electrode;
forming a reflective cup on the substrate, the reflective cup covering the at least one barrier portion, a bonding force between the reflective cup and the electrode being smaller than that between the at least one barrier portion and the electrode;
providing an LED die in the reflective cup and electrically connecting the LED die to the electrode; and
forming an encapsulation in the reflective cup, the encapsulation covering the LED die;
wherein a distance is remained between an edge of the electrode and a first side of the substrate, and an insulation area is defined by the substrate between the edge of the electrode and the first side, the barrier portion spanning across the electrode and contacting the insulation area.

2. A method for making an LED package, comprising:
providing a substrate with an electrode formed thereon;
forming at least one barrier portion on the electrode;
forming a reflective cup on the substrate, the reflective cup covering the at least one barrier portion, a bonding force between the reflective cup and the electrode being smaller than that between the at least one barrier portion and the electrode;
providing an LED die in the reflective cup and electrically connecting the LED die to the electrode; and
forming an encapsulation in the reflective cup, the encapsulation covering the LED die;
wherein the reflective cup is formed on the substrate along sides of the substrate, the reflective cup completely covering the barrier portion, the reflective cup and the barrier portion surrounding the LED die and receiving the LED die therein.

3. The method of claim 2, wherein the reflective cup is formed by injection molding or transfer molding.

* * * * *